(12) United States Patent
de Hoog et al.

(10) Patent No.: US 10,690,707 B2
(45) Date of Patent: Jun. 23, 2020

(54) SYSTEM AND METHOD FOR VERIFYING AN ENERGY GENERATION SOURCE

(71) Applicant: International Business Machines Corporation, Armonk, NY (US)

(72) Inventors: Julian de Hoog, Greensborough (AU); Dileban Karunamoorthy, Carlton (AU); Ramachandra Rao Kolluri, Balaclava (AU); Arun Vishwanath, Melbourne (AU)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/176,695

(22) Filed: Oct. 31, 2018

(65) Prior Publication Data
US 2020/0132737 A1 Apr. 30, 2020

(51) Int. Cl.
*G01R 19/25* (2006.01)
*G01R 22/06* (2006.01)
*H02J 3/38* (2006.01)

(52) U.S. Cl.
CPC ....... *G01R 19/2513* (2013.01); *G01R 22/061* (2013.01); *H02J 3/382* (2013.01)

(58) Field of Classification Search
CPC .............. G01R 19/2513; G01R 22/061; G01R 31/083; G01R 19/165; H02J 3/382; H02J 3/36; H02J 3/14; H02J 3/005
See application file for complete search history.

(56) References Cited

U.S. PATENT DOCUMENTS

| 4,147,978 | A | * | 4/1979 | Hicks | G01R 21/007 324/142 |
|---|---|---|---|---|---|
| 7,188,003 | B2 | | 3/2007 | Ransom et al. | |
| 7,925,552 | B2 | | 4/2011 | Tarbell et al. | |
| 8,138,914 | B2 | | 3/2012 | Wong et al. | |
| 9,644,993 | B2 | | 5/2017 | Adest et al. | |
| 9,887,971 | B2 | | 2/2018 | Mallett et al. | |
| 9,903,893 | B2 | | 2/2018 | Da Silva et al. | |
| 2002/0006045 | A1 | * | 1/2002 | Shirai | H02M 1/32 363/17 |
| 2009/0234757 | A1 | | 9/2009 | Tarbell et al. | |
| 2010/0057582 | A1 | * | 3/2010 | Arfin | G06Q 30/0601 705/26.1 |

(Continued)

FOREIGN PATENT DOCUMENTS

EP 3276773 A1 1/2018
JP 2015-070642 A 4/2015

OTHER PUBLICATIONS

Camacho, et al., "Control for Renewable Energy and Smart Grids", The Impact of Control Technology, 2011.

(Continued)

*Primary Examiner* — Christopher P McAndrew
*Assistant Examiner* — Zannatul Ferdous
(74) *Attorney, Agent, or Firm* — Joseph Petrokaitis, Esq.; McGinn IP Law Group, PLLC

(57) ABSTRACT

A system for verifying an energy generation source, includes a key forming device that forms a key in a DC voltage signal generated by the energy generation source, and a verifying device that verifies the energy generation source based on the key in the DC voltage signal.

20 Claims, 4 Drawing Sheets

(56) References Cited

U.S. PATENT DOCUMENTS

| | | | |
|---|---|---|---|
| 2010/0211812 A1* | 8/2010 | Bullen | G06Q 30/02 |
| | | | 713/340 |
| 2010/0332373 A1 | 12/2010 | Crabtree et al. | |
| 2012/0054017 A1* | 3/2012 | Rao | G06Q 30/0207 |
| | | | 705/14.39 |
| 2013/0007458 A1 | 1/2013 | Wakita et al. | |
| 2013/0085693 A1* | 4/2013 | Da Silva | H02J 3/008 |
| | | | 702/61 |
| 2015/0100257 A1 | 4/2015 | Adest et al. | |
| 2017/0048207 A1 | 2/2017 | Mallett et al. | |
| 2017/0358041 A1 | 12/2017 | Forbes, Jr. et al. | |

OTHER PUBLICATIONS

Mohassel, et al., "A Survey on Advanced Metering Infrastructure", Electrical Power and Energy Systems, 2014.

"International Markets for Renewable Energy Certificates (RECs)", Sustainable Real Estate Roundtable Member Briefing, 2012 Sustainability Roundtable, Inc.

\* cited by examiner

SYSTEM AND METHOD FOR VERIFYING AN ENERGY GENERATION SOURCE

BACKGROUND

The present invention relates generally to a system and method of verifying an energy generation source, and more particularly, to a system and method that includes verifying the energy generation source based on a key in a DC voltage signal.

In many countries, incentives have been introduced to promote the installation of renewable energy generation sources, such as solar photovoltaic and wind energy. Such incentives often take the form of some sort of certificate, or "guarantee of origin" (in Europe), which is usually a tradable commodity that represents a claim to the environmental benefits associated with renewable power generation.

Such certificates may be traded electronically. Sellers make a profit for generating clean energy, and buyers can validly claim that the energy they are consuming or reselling is truly renewable.

SUMMARY

An exemplary embodiment of the present invention may include a system for verifying an energy generation source, including a key forming device that forms a key in a DC voltage signal generated by the energy generation source, and a verifying device that verifies the energy generation source based on the key in the DC voltage signal. One or more other exemplary embodiments include a method and a computer program product.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways that should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The exemplary aspects of the present invention will be better understood from the following detailed description of the exemplary embodiments of the invention with reference to the drawings, in which.

DETAILED DESCRIPTION

Figure 1:
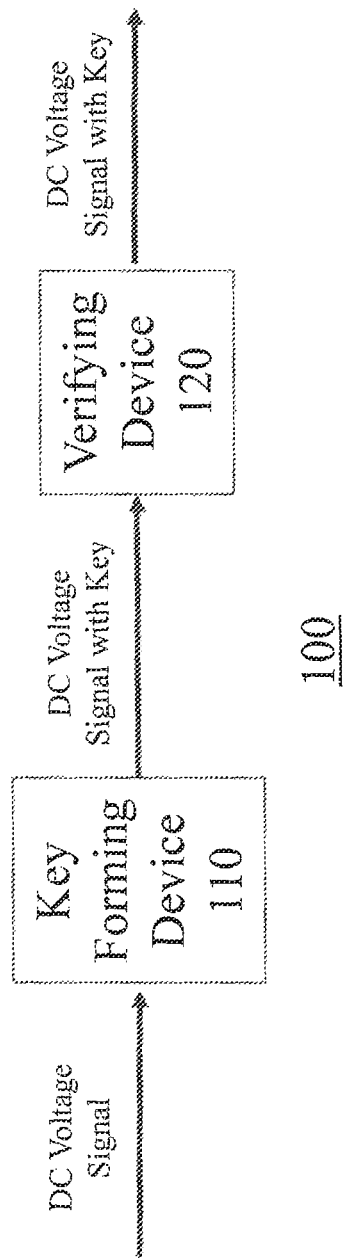
FIG. 1 depicts a system 100 for verifying an energy generation source, according to an exemplary aspect of the present invention.

The invention will now be described with reference to FIGS. 1-4, in which like reference numerals refer to like parts throughout. It is emphasized that, according to common practice, the various features of the drawing are not necessarily to scale. On the contrary, the dimensions of the various features can be arbitrarily expanded or reduced for clarity. Exemplary embodiments are provided below for illustration purposes and do not limit the claims.

One issue with many of the related art systems is that the tracking of the units of energy, and the related reimbursement, can be complex and time-consuming Taking European Guarantees of Origin (GoO) as an example, each GoO is assigned and identified by a unique number. It is then tracked as it is bought and sold from producer to broker/supplier to consumer by the relevant authorities. This trade may occur across borders and involve bodies in multiple administrative domains. It is therefore essential to ensure there is no double counting to ensure that green electricity contracts are reliable.

In other words, there are multiple generating entities, multiple purchasing entities, and multiple entities that provide certification. Trade can occur cross-border. As a result, distributed ledger technologies (such as blockchain) that can ensure provenance, transparency and immutability of data can increase trust in the entire process while also making it more efficient and less costly.

However, ultimately the quantity being traded is energy, and units of energy must be measured in a trusted, tamper-proof manner. Thus, some form of certified, tamper-proof, trusted meter is important (e.g., essential). At system install, the generation source and tamper-proof meter must be sighted and validated by a certification authority to enable participation.

However, risks remain. Following certification, it is possible that a generator may consider switching their generation source while still receiving credits for "renewable generation". For example, a participant may have installed a set of solar panels, received accreditation, and may then subsequently install a non-certified generation source to replace or ameliorate the original renewable system. The meter, even if it is not tampered with itself, may not be able to tell the difference, and the participant would incorrectly receive credits for non-certified generation.

None of the prior or related art specifically describe a way to use an understanding of context (system specifications, weather, matching anticipated generation to environmental conditions) to ensure that the generated energy that reaches the trusted meter was truly generated in an approved, renewable way.

An exemplary aspect of the present invention provides a system and method that is more reliable than related art systems and methods at validating that an electrical energy generation source is truly producing certified renewable energy. In particular, an exemplary aspect of the present may provide a system and method to validate a source of energy generation, so that tampering is practically impossible (e.g., no tampering is possible), and so that trading of renewable energy credits becomes a highly trusted (e.g., fully trusted) process.

FIG. 1 illustrates a system 100 for verifying an energy generation source, according to an exemplary aspect of the present invention.

As illustrated in FIG. 1, the system 100 includes a key forming device 110 that forms a key in a DC voltage signal generated by the energy generation source, and a verifying device 120 that verifies the energy generation source based on the key in the DC voltage signal.

The key forming device 110 may include, for example, a switch (e.g., secure switch) that adjusts a voltage of the DC voltage signal. The key forming device 110 may be located, example, at the site of the energy generation source.

Figure 2A:
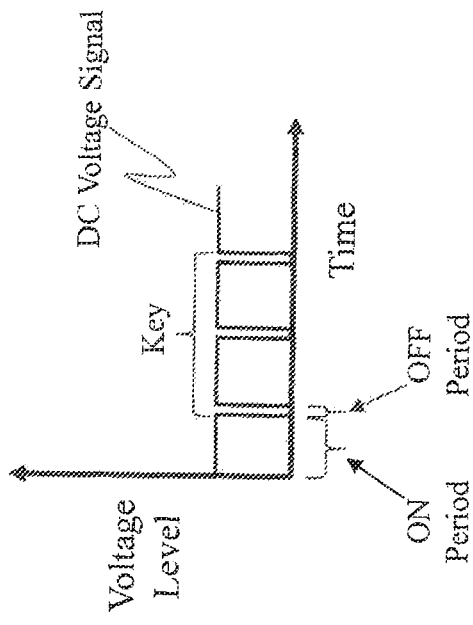
FIG. 2A illustrates a DC voltage signal generated by an energy generation source, according to another exemplary aspect of the present invention.
Figure 2B:
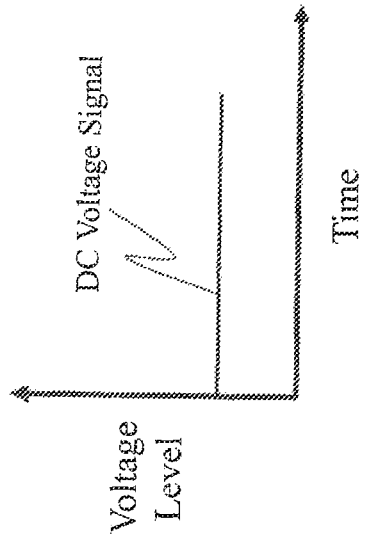
FIG. 2B illustrates the DC voltage signal of FIG. 2A after the switch has formed a key in the DC voltage signal, according to another exemplary aspect of the present invention.

In particular, the switch may switch OFF the DC voltage signal so that the key includes an OFF pattern in the DC voltage signal. FIG. 2A illustrates a DC voltage signal generated by an energy generation source, according to another exemplary aspect of the present invention. FIG. 2B illustrates the DC voltage signal of FIG. 2A after the switch has formed a key in the DC voltage signal, according to another exemplary aspect of the present invention. As illustrated in FIG. 2B, the key in the DC voltage signal is comprised of an OFF pattern in the DC voltage signal—one or more times where the DC voltage signal is turned OFF (e.g., has no measurable voltage) by the switch.

The verifying device 120 may include, for example, an energy meter (e.g., trusted energy meter) which measures an amount of energy used by a consumer. The verifying device 120 may be located at a customer location (e.g., location of a customer which is using the energy (e.g., DC voltage signal) generated by the energy generation source.

The energy generation source may include, for example, a renewable energy generation source that generates the DC voltage signal, such as a solar energy generation source and a wind energy generation source.

The system 100 may also include, for example, a generation accreditation authority that remunerates (e.g., in the form of cash, credit, etc.) the energy generation source based on data from the verifying device 120 (e.g., energy meter). The generation accreditation authority may maintain a database (e.g., key database) associating the key with the energy generation source. The generation accreditation authority may also update the key and transmit the updated key to the energy generation source and to the verifying device 120 (e.g., energy meter) via a secure, bidirectional communication line.

The system 100 may also include, for example, an analytics module that analyzes the DC voltage signal and/or the AC voltage/current signal to further verify the energy generation source (e.g., as a renewable energy generation source). The analytics module may be located, for example, in the verifying device 120 or the generation accreditation authority.

For example, in an exemplary aspect of the present invention, the verifying device 120 includes an energy meter, and the analytics module may analyze the DC voltage signal by analyzing a timing of energy measured by the energy meter, analyzing a maximum value of the energy measured by the energy meter, analyzing a minimum value of the energy measured by the energy meter, analyzing a total amount of the energy measured by the energy meter over period of time, analyzing the energy measured by the energy meter based on weather, and/or analyzing the energy measured by the energy meter based on system specifications for the energy generation source.

Figure 3:
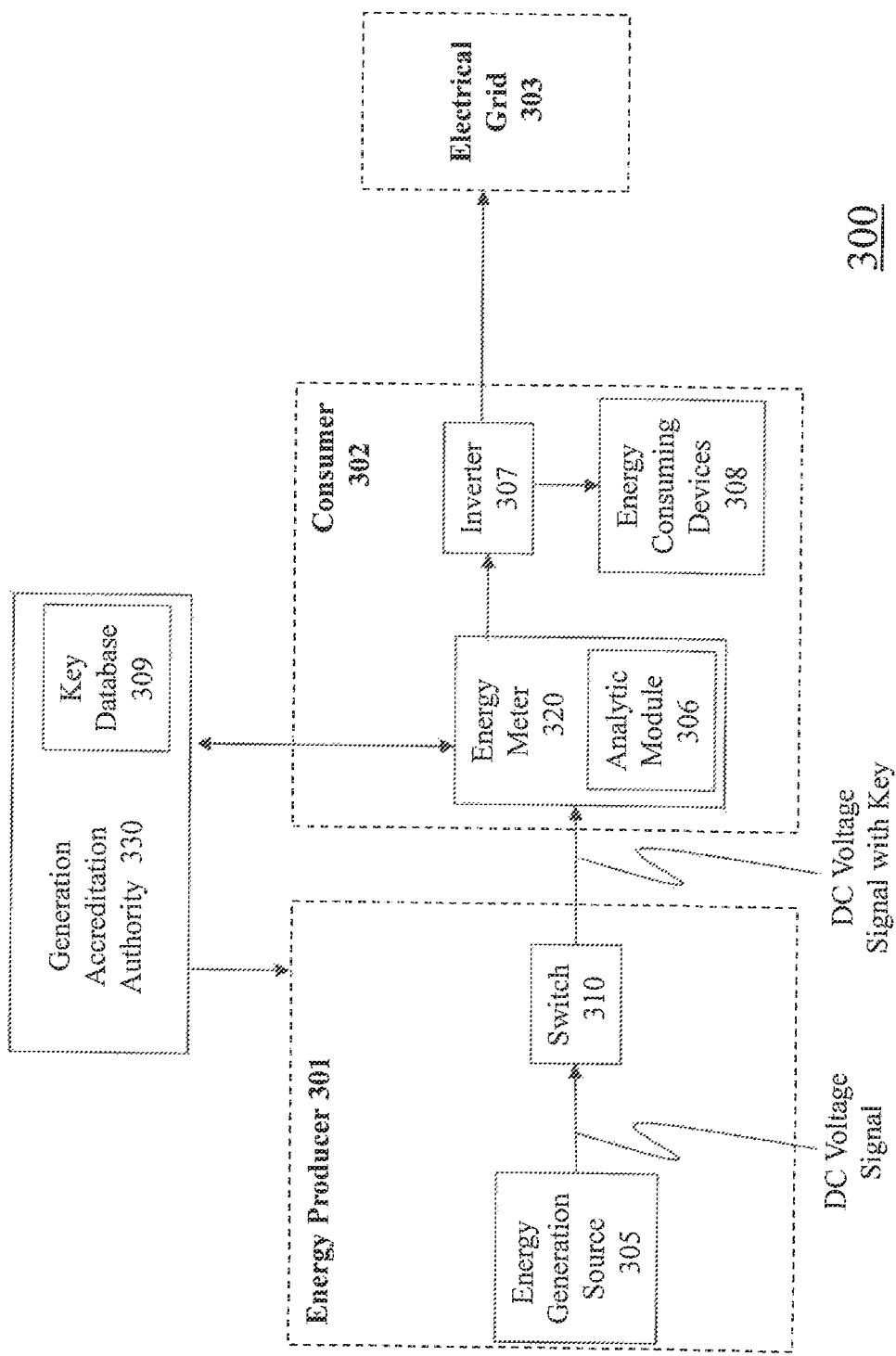
FIG. 3 illustrates a system 300 for verifying an energy generation source, according to another exemplary aspect of the present invention.

FIG. 3 illustrates a system 300 for verifying an energy generation source, according to another exemplary aspect of the present invention. The system 300 includes all of the features and functions described above with respect to the system 100 in FIG. 1.

As illustrated in FIG. 3, the system 300 includes a switch 310 corresponding to the key forming device 110 in FIG. 1, and an energy meter 320 corresponding to the verifying device 120 in FIG. 1.

In the system 300, an energy producer 301 (e.g., energy company) includes an energy generation source 305 (e.g., renewable generation source, such as solar or wind) that generates a DC voltage signal (e.g., DC current). The energy producer 301 may be the owner of the energy generation source 305. For example, the energy producer 301 may be the owner of a windmill farm, or the owner of a house having solar panels mounted thereon.

Energy generated by the energy generation source 305 is transmitted to a consumer 302 (e.g., plurality of consumers 302) in the form of a DC voltage signal. The energy may metered at the location (e.g., home) of the consumer by the energy meter 320. The location of the consumer 302 may also include an inverter 307 which converts the DC voltage signal into an AC signal which may be transmitted to energy consuming devices 308 (e.g., refrigerator, television, etc.) at the location of the consumer 302.

The inverter 307 may be integrated into the energy meter 320. The consumer 302 may also transmit excess power from the inverter 307 to the electrical grid 303 or other consumers 302.

The energy producer 301 may also include the switch 310 (e.g., secure switch) that can generate a key, such as by cutting off energy generation supply according to a "switching pattern". The term "secure switch" here should be understood to mean a switch that is substantially tamper resistant.

The switch 310 may be integrated within the energy generation source 305. For example, where the energy generation source 305 is a solar panel, the switch 310 may be included in the solar panel, and so on. In particular, the switch 310 could be integrated within the microelectronics that drive the MPPT (maximum power point tracker) of the solar panel. Alternatively, the switch 310 may be located somewhere on an energy transmission line for transmitting the DC voltage signal between the energy generation source 305 and the consumer 302.

The "switching pattern" may be considered a type of signature that is recognizable to the energy meter 320. The switching pattern may involve switching OFF the DC voltage signal (e.g., energy generation supply) for a brief period (e.g., less than 10 milliseconds) for a number of times over a short duration. For example, a first key may be formed by using a first switching pattern where the DC voltage signal is switched OFF for 5 milliseconds, for three times over a 100 millisecond duration. A second key may be formed by using a second switching pattern where the DC voltage signal is switched OFF for 3 milliseconds, for 5 times over a 100 millisecond duration, and so on.

In addition, as illustrated in FIG. 2B, the switching pattern includes an ON period and an OFF period which may be adjusted in order to provide a unique "bar code-like" pattern. For example, the switching pattern may have three OFF periods of 2, 8 and 3 milliseconds which are separated by two ON periods of 7 and 1 milliseconds. That is, the switching pattern would be (in chronological order): OFF-2/ON-7/OFF-8/ON-1/OFF-3. The switching pattern may be periodically regenerated, such as once a minute.

In the system 300, the energy meter 320 may include a trusted meter or tamper-proof, certified meter, that may be used to generate renewable energy credits. The term "trusted meter" here should be understood to mean a meter that is substantially tamper resistant.

The energy meter 320 may include circuitry for recognizing the "signature" of the switching pattern. This recognition may include considering a modified version of the switching pattern arising from noisy/filtering effects of connected circuitry, for example using machine learning or dynamic modelling of the renewable energy generation system. If the energy meter 320 recognizes the signature of the switching pattern in the DC voltage signal, then the energy meter 320 may verify that the DC voltage signal received by the energy meter 320 is renewable energy from the energy generation source 305.

The energy meter 320 may include an analytic module 306 that performs a set of checks to validate that the generated energy indeed comes from the energy generation source (e.g., renewable energy generation source). Alternatively, the analytic module 306 may be located somewhere on an energy transmission line for transmitting the DC voltage signal between the energy generation source 305 and the consumer 302.

The analytic module 306 may analyze the DC voltage signal in order to verify that the DC voltage signal is from a renewable energy source (e.g., energy generation source 305). For example, the analytic module 306 may also analyze the DC voltage/current signals and/or AC voltage/current signals to compare peak generation to rated peak generation, compare generation over a time period to expected generation over that time period for the of the energy generation source 305, and/or compare generation of a time period to anticipated generation based on weather, sensor measurements (such as skycaps), generation from neighbors, etc.

The energy meter 320 may use the analytic module 306 and/or recognition of the key (e.g., switching pattern) corresponding to the switch 310, to validate that the DC voltage signal is renewable energy.

The analytic module 306 may transmit (e.g., periodically transmit) data generated therein to a generation accreditation authority 330. As another alternative, the analytic module 306 may be located in the generation accreditation authority 330.

The generation accreditation authority 330 may be tasked with remunerating the energy producer 301 (e.g., owner or operator) based on data from the analytics module 306 indicating the amount of renewable energy which is generated by the energy generation source 305 (e.g., the amount of energy consumed by the consumer 302).

For example, the energy producer 301 (e.g., owner) may buy and sell energy on a dynamic market, and the generation accreditation authority 330 may confirm the amount and nature of energy sold by the energy producer 301.

The generation accreditation authority 330 may also maintain a key database 309 which associates a key with the energy generation source 305. The generation accreditation authority 330 may periodically change and securely distribute the key to the switch 310 (e.g., secure switch) and energy meter 320 (e.g., smart meter).

The generation accreditation authority 330 may also be a decentralized autonomous organization (blockchain network) with Smart Contracts for tracking energy generation and rewarding credits/tokens to the energy producer 301 (e.g., plurality of energy producers 301). The generation accreditation authority 330 may also keep track of amounts of renewable energy generated and remunerate relevant parties (e.g., energy producers 301) accordingly In an exemplary aspect of the present invention, the system 300 may verify that the generated energy reported by the energy meter 320 is truly from a renewable energy source. The system 300 may accomplish this by performing at least one of the following verification processes:

1. Generating a Specific Key that May be Periodically Recognized within the Meter 320.

This key may be generated by the switch 310 that is coupled to the energy generation source 305, and in particular, may be deeply embedded within the circuitry/microcontroller of the energy generation source 305. The key is expressed in terms of a switching OFF of the DC voltage signal generated by the energy generation source 305 according to a switching pattern similar to a barcode. The switching pattern may be periodically regenerated (e.g., the key may be periodically formed in the DC voltage signal), for example once a minute.

2. Running a Set of Simple Sanity Checks on the Data Reported by the Energy Meter 320.

Data (e.g., energy data) may be collected by the energy meter 320 and analyzed by the analytic module 306. For example, the energy meter 320 may collect data on the amount of energy being received by the energy generation source 305. For example, it is well-known that a solar energy generation source cannot generate energy after sunset. Thus, if the energy generation source 305 is a solar energy generation source, and data collected by the energy meter 320 indicates that it received energy from the energy generation source 305 after sunset, then the analytics module 306 may use this data to alert the generation accreditation authority 330 that the energy from the energy generation source 305 is unverified.

As other examples, it is well-known that in a given location a 4 kW rated solar generation system cannot realistically generate more than 40 kWh in a given day, and that a 10 kW peak rated wind generation system cannot at any time generate 12 kW. The analytics module 306 may (e.g., periodically or continuously) compare the data from the energy meter 320 with such reference data to label the energy from the energy generation source 305 as being unverified.

It should also be noted that the generation accreditation authority 330 may collect the energy data from the energy meter 320 and/or the analytic data generated by the analytic module 306 (by analyzing the energy data), from a plurality of consumers 302 who receive energy from the energy generation source 305. The generation accreditation authority 330 may store such data from the plurality of consumers 302, and check it (periodically or continuously) to further verify that the energy generated by the energy generation source 305 is from a renewable energy source.

In particular, sanity checks such as those discussed above, may be performed on the data from the plurality of consumers 302 by the generation accreditation authority 330 in order to further verify (or unverify) the energy from the energy generation source 305. For example, if the energy generation source 305 is a 4 kW rated solar generation system (with a maximum of 40 kWh in a given day) and the generation accreditation authority 330 checks the data received from the plurality of consumers 302 and the data indicates that in one day, twenty consumers received 3 kWh of energy for a total of 60 kWh of energy, then the generation accreditation authority 330 may "unverify" the energy from the energy generation source 305.

3. Comparing Output of the System 300 to Forecast Data Specific to the System 300.

The analytic module 306 may store reference data (e.g., history data) in memory or may access the reference data (e.g., via a secure line) stored at the generation accreditation authority 330 or elsewhere. Such reference data may include, for example, geography, layout, system specifications, weather, and any other factors affecting output of the energy generation source 305.

Such reference data may include, for example, the fact that a solar PV generation system cannot generate much on a cloudy day and a wind generation system cannot generate on a windless day, or that an East-facing solar generation system cannot have a spike in generation in the afternoon or evening, etc. That is, the analytic module 306 may include a forecasting/analytic capacity based on system specifications, including system geolocation.

4. Comparing the Characteristics of the DC Voltage Signal (e.g., Energy) Received from the Energy Generation Source 305 with Reference Characteristics.

The energy meter 320 may collect data about the characteristics of energy, such as power quality of the DC voltage signal, and the analytic module 306 may compared the collected data to reference data (e.g., stored in the analytic module 306) indicated the expected characteristics (e.g., expected power quality). Such reference data may include, for example, the fact that a wind generation system is unlikely to have very steep ramp up and ramp down, that both solar and wind generation systems may have specific harmonic distortion, and so on.

Figure 4:
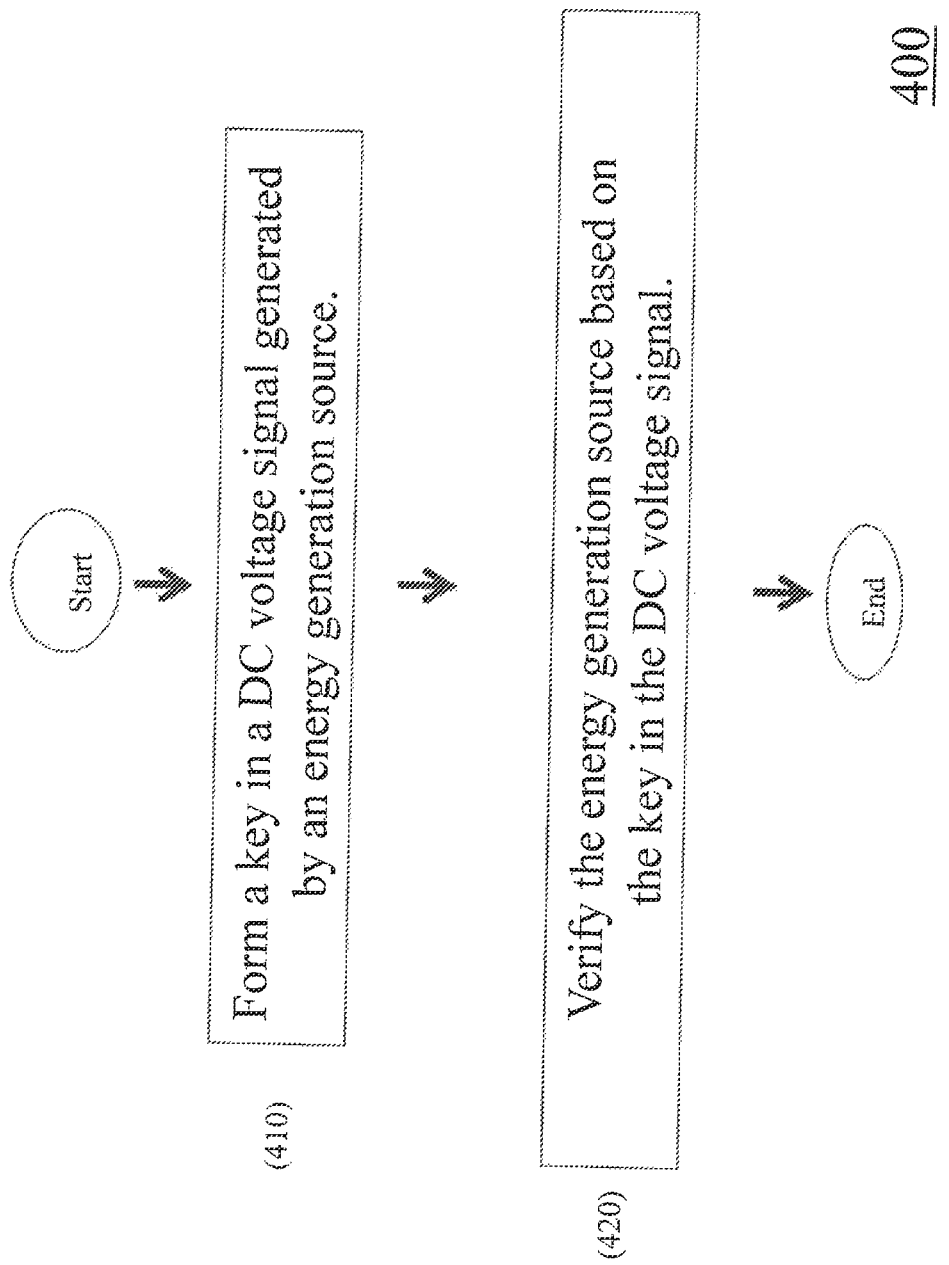
FIG. 4 illustrates a method 400 of verifying an energy generation source, according to an exemplary aspect of the present invention.

Referring again to the drawings, FIG. 4 illustrates a method 400 of verifying an energy generation source, according to an exemplary aspect of the present invention.

As illustrated in FIG. 4, the method 400 includes forming (410) a key in a DC voltage signal generated by the energy generation source, and verifying (420) the energy generation source based on the key in the DC voltage signal. The method 400 may include all of the functions and features described above with respect to the system 100 and system 300.

Referring to FIGS. 1-4, another aspect of the present invention is directed to a computer program product which may include, for example, a computer readable storage medium (hereinafter, the "storage medium") that may store computer readable program instructions (hereinafter, the "computer program" or "instructions") for performing the features and functions of the method 100, 300 of processing a data query, and the system 200, 400, 500, 600 for processing a data query, the data query workflow 700, and the offline rebuild workflow 800. That is, the storage medium may store the instructions thereon for causing a processing device (e.g., computer, instruction execution device, computing device, computer processor, central processing unit (CPU), microprocessor, etc.) to perform a feature or function of the present invention.

The storage medium can be a tangible device that can retain and store the instructions for execution by the processing device. The storage medium may be, for example, but is not limited to, an electronic storage device, a magnetic storage device, an optical storage device, an electromagnetic storage device, a semiconductor storage device, or any suitable combination of the foregoing.

A non-exhaustive list of more specific examples of the storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

The storage medium, as used herein, should not be construed as merely being a "transitory signal" such as a radio wave or other freely propagating electromagnetic wave, an electromagnetic wave propagating through a waveguide or other transmission media (e.g., light pulses passing through a fiber-optic cable), or an electrical signal transmitted through a wire.

The processing device can access the instructions on the storage medium. Alternatively, the processing device can access (e.g., download) the instructions from an external computer or external storage device via a network such as the Internet, a local area network, a wide area network and/or a wireless network.

The network may include, for example, copper transmission cables, optical transmission fibers, wireless transmission, routers, firewalls, switches, gateway computers and/or edge servers. For example, the processing device may include a network adapter card or network interface which receives the instructions from the network and forwards the instructions to the storage medium within the processing device which stores the instructions.

The instructions for performing the features and functions of the present invention may include, for example, assembler instructions, instruction-set-architecture (ISA) instructions, machine instructions, machine dependent instructions, microcode, firmware instructions, state-setting data, or either source code or object code written in one or more programming languages (or combination of programming languages), including an object oriented programming language such as Java, Smalltalk, C++ or the like, and conventional procedural programming languages, such as the "C" programming language or similar programming languages.

The instructions may execute entirely on the processing device (e.g., a user's computer), partly on the processing device, as a stand-alone software package, partly on the processing device and partly on a remote computer or entirely on the remote computer or a server. For example, the instructions may execute on a remote computer which is connected to the processing device (e.g., user's computer) through a network such as a local area network (LAN) or a wide area network (WAN), or may execute on an external computer which is connected to the processing device through the Internet using an Internet Service Provider.

The processing device may include, for example, electronic circuitry including, for example, programmable logic circuitry, field-programmable gate arrays (FPGA), or programmable logic arrays (PLA) that may execute the instructions by utilizing state information of the instructions to personalize the electronic circuitry, in order to perform a feature or function of the present invention.

It should be noted that the features and functions of the present invention which are described above with reference to FIGS. 1-4 may be implemented by the processing device executing the instructions. That is, each block of the flowchart illustrations and/or block diagrams, and combinations of blocks in the flowchart illustrations and/or block diagrams, can be implemented by processing device executing the instructions.

The instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

That is, the instructions may be executed by a processing device to cause a series of operational steps to be performed by the processing device to produce a computer-implemented process, so that the executed instructions implement the features/functions/acts described above with respect to the flowchart and/or block diagram block or blocks of FIGS. 1-4.

Thus, the flowchart and block diagrams in the FIGS. 1-4 illustrate not only a method, system, apparatus or device, but also illustrate the architecture, functionality, and operation of the processing device executing the instructions. In this regard, each block in the flowchart or block diagrams may represent a module, segment, or portion of the instructions, which comprises one or more executable instructions for implementing the specified logical function(s). In some alternative implementations, the features or functions in the block may occur out of the order noted in the figures.

For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A system for verifying an energy generation source, comprising:
   a key forming device that forms a key comprising an OFF pattern in a DC voltage signal generated by the energy generation source; and
   a verifying device that verifies the energy generation source based on the key in the DC voltage signal.

2. The system of claim 1, wherein the energy generation source comprises a renewable energy generation source that generates the DC voltage signal.

3. The system of claim 1, wherein the key forming device comprises a switch that adjusts a voltage of the DC voltage signal, and the verifying device comprises an energy meter which measures an amount of energy generated by the DC voltage signal.

4. The system of claim 3, wherein the switch switches OFF the DC voltage signal so that the key comprises the OFF pattern in the DC voltage signal.

5. The system of claim 3, further comprising:
   an analytics module that analyzes the DC voltage signal to further verify the energy generation source.

6. The system of claim 5, wherein the analytics module analyzes the DC voltage signal by at least one of:
   analyzing a timing of generated energy measured by the energy meter;
   analyzing a maximum value of the generated energy measured by the energy meter;
   analyzing a minimum value of the generated energy measured by the energy meter;
   analyzing a total amount of the generated energy measured by the energy meter over a period of time;
   analyzing the generated energy measured by the energy meter based on weather; and
   analyzing the generated energy measured by the energy meter based on system specifications for the energy generation source.

7. The system of claim 6, further comprising:
   a generation accreditation authority that remunerates the energy generation source based on data from the energy meter.

8. The system of claim 7, wherein the energy meter is located at a location of a consumer, and the analytics module is located in one of the energy meter and the generation accreditation authority.

9. The system of claim 7, wherein the generation accreditation authority maintains a key database associating the key with the energy generation source.

10. The system of claim 9, wherein the generation accreditation authority updates the key and transmits the updated key to the energy generation source and to the energy meter via a secure, bidirectional communication line.

11. A method of verifying an energy generation source, comprising:
    forming a key comprising an OFF pattern in a DC voltage signal generated by the energy generation source; and
    verifying the energy generation source based on the key in the DC voltage signal.

12. The method of claim 11, wherein the energy generation source comprises a renewable energy generation source that generates the DC voltage signal.

13. The method of claim 11, wherein the forming of the key is performed by a switch that adjusts a voltage of the DC voltage signal, and the verifying of the energy generation source is performed by a verifying device that includes an energy meter which measures an amount of energy generated by the DC voltage signal.

14. The method of claim 13, wherein the switch switches OFF the DC voltage signal so that the key comprises the OFF pattern in the DC voltage signal.

15. The method of claim 11, further comprising:
    analyzing the DC voltage signal to further verify the energy generation source.

16. The method of claim 15, wherein the verifying of the energy generation source is performed by an energy meter which measures an amount of generated energy, and the analyzing of the DC voltage signal comprises at least one of:

analyzing a timing of generated energy measured by the energy meter;

analyzing a maximum value of the generated energy measured by the energy meter;

analyzing a minimum value of the generated energy measured by the energy meter;

analyzing a total amount of the generated energy measured by the energy meter over a period of time;

analyzing the generated energy measured by the energy meter based on weather; and analyzing the generated energy measured by the energy meter based on system specifications for the energy generation source.

17. The method of claim 16, further comprising:

remunerating the energy generation source based on data from the energy meter.

18. The method of claim 17, wherein the energy meter is located at a location of a consumer, and an analytics module is located in one of the energy meter and a generation accreditation authority.

19. The method of claim 17, wherein a generation accreditation authority maintains a key database associating the key with the energy generation source, and wherein the generation accreditation authority updates the key and transmits the updated key to the energy generation source and to the energy meter via a secure, bidirectional communication line.

20. A computer program product for verifying an energy generation source, the computer program product comprising a non-transitory computer-readable storage medium having program instructions embodied therewith, the program instructions executable by a computer to cause the computer to perform:

forming a key comprising an OFF pattern in a DC voltage signal generated by the energy generation source; and verifying the energy generation source based on the key in the DC voltage signal.

* * * * *